United States Patent
Kamiya et al.

(10) Patent No.: US 8,274,070 B2
(45) Date of Patent: Sep. 25, 2012

(54) SEMICONDUCTOR LIGHT-EMITTING ELEMENT INCLUDING AN AUXILIARY ELECTRODE

(75) Inventors: Masao Kamiya, Kiyosu (JP); Yukitaka Hasegawa, Kiyosu (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 0 days.

(21) Appl. No.: 12/929,757

(22) Filed: Feb. 14, 2011

(65) Prior Publication Data

US 2011/0210310 A1 Sep. 1, 2011

(30) Foreign Application Priority Data

Feb. 26, 2010 (JP) .................. 2010-042519

(51) Int. Cl.
*H01L 29/06* (2006.01)
(52) U.S. Cl. ...... 257/13; 257/12; 257/765; 257/E33.012
(58) Field of Classification Search .............. 257/12, 257/13, 765
See application file for complete search history.

(56) References Cited

U.S. PATENT DOCUMENTS

| | | |
|---|---|---|
| 6,614,056 B1 | 9/2003 | Tarsa et al. |
| 6,677,805 B2 | 1/2004 | Shor et al. |
| 2008/0299687 A1* | 12/2008 | Song et al. ............ 438/22 |
| 2011/0062484 A1 | 3/2011 | Tanaka et al. |

FOREIGN PATENT DOCUMENTS

| | | |
|---|---|---|
| JP | 2001-345480 | 12/2001 |
| JP | 2003-524295 | 8/2003 |
| JP | 2006-128227 A | 5/2006 |
| JP | 2006-156590 A | 6/2006 |
| JP | 2011-061127 A | 3/2011 |

OTHER PUBLICATIONS

Japanese Office Action dated Jul. 10, 2012 (With Partial English Translation).

* cited by examiner

*Primary Examiner* — Marcos D. Pizarro
*Assistant Examiner* — Eva Yan Montalvo
(74) *Attorney, Agent, or Firm* — McGinn IP Law Group, PLLC

(57) ABSTRACT

A semiconductor light-emitting element includes a semiconductor laminated body including a first conductivity type layer, a light-emitting layer and a second conductivity type layer in this order, a transparent electrode formed on the first conductivity type layer and comprising an oxide, and an auxiliary electrode formed between the first conductivity type layer and the transparent electrode, the auxiliary electrode having a higher reflectivity to light emitted from the light-emitting layer, a larger contact resistance with the first conductivity type layer and a smaller sheet resistance than the transparent electrode.

9 Claims, 7 Drawing Sheets

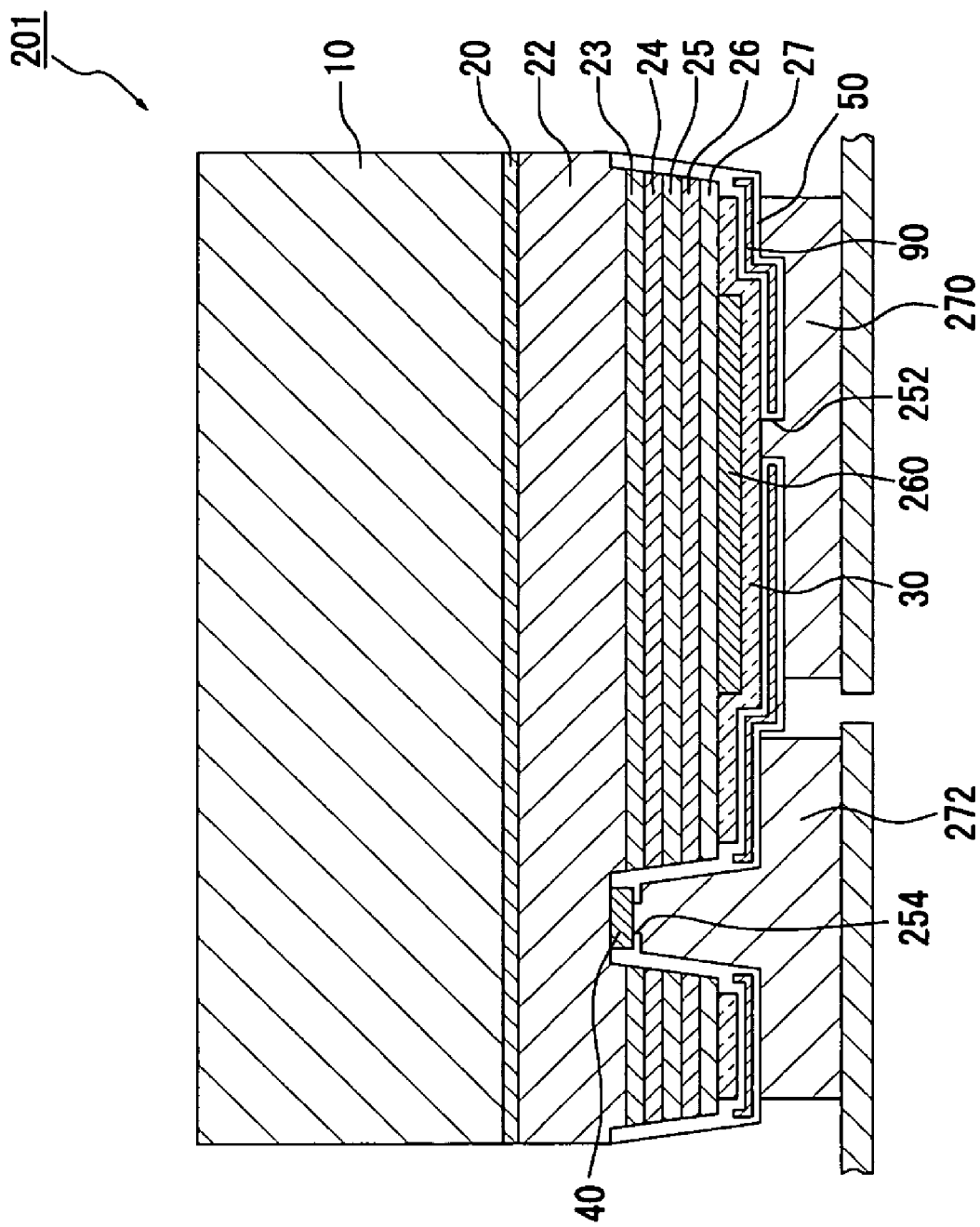

SEMICONDUCTOR LIGHT-EMITTING ELEMENT INCLUDING AN AUXILIARY ELECTRODE

The present application is based on Japanese Patent Application No. 2010-042519 filed on Feb. 26, 2010, the entire contents of which are incorporated herein by reference.

BACKGROUND OF THE INVENTION

1. Field of the Invention

The invention relates to a semiconductor light-emitting element provided with a semiconductor laminated body which has a first conductivity type layer, a light-emitting layer and a second conductivity type layer in this order.

2. Description of the Related Art

A conventional semiconductor light-emitting element of this type is known which is provided with a semiconductor laminated body having a first conductivity type layer, a light-emitting layer and a second conductivity type layer in this order (see, e.g., JP-T 2003-524295). In this light-emitting element, a transparent electrode made of ITO is formed on the first conductivity type layer and an auxiliary electrode for diffusing an electric current is further formed on the transparent electrode.

However, the semiconductor light-emitting element described in JP-T 2003-524295 has a problem that, even though light incident on the transparent electrode from the light-emitting layer is reflected at the auxiliary electrode, the light is more than a little absorbed in the transparent electrode.

SUMMARY OF THE INVENTION

It is an object of the invention to provide a semiconductor light-emitting element that allows improvement in light extraction efficiency of an element without losing current diffusivity in a semiconductor laminated body.

(1) According to one embodiment of the invention, a semiconductor light-emitting element comprises:

a semiconductor laminated body comprising a first conductivity type layer, a light-emitting layer and a second conductivity type layer in this order;

a transparent electrode formed on the first conductivity type layer and comprising an oxide; and an auxiliary electrode formed between the first conductivity type layer and the transparent electrode, the auxiliary electrode having a higher reflectivity to light emitted from the light-emitting layer, a larger contact resistance with the first conductivity type layer and a smaller sheet resistance than the transparent electrode.

In the above embodiment (1) of the invention, the following modifications and changes can be made.

(i) The auxiliary electrode comprises a linear extending portion.

(ii) The semiconductor light-emitting element further comprising:

a surface electrode formed on the auxiliary electrode or the transparent electrode so as to overlap at least a portion of the auxiliary electrode in a top view.

(iii) The semiconductor light-emitting element further comprising:

a second conductivity type layer electrode formed on the second conductivity type layer and comprising the same material as the surface electrode.

(iv) The semiconductor light-emitting element comprises a face-up type semiconductor light-emitting element, and the surface electrode has a higher bonding strength with a bonding wire than the transparent electrode and the auxiliary electrode.

(v) The semiconductor light-emitting element comprises a flip-chip type semiconductor light-emitting element, and the surface electrode has a higher bonding strength with a bump than the transparent electrode and the auxiliary electrode.

(vi) The transparent electrode extends outward from a periphery of the auxiliary electrode while covering a part of the auxiliary electrode in a top view.

ADVANTAGES OF THE INVENTION

According to one embodiment of the invention, a semiconductor light-emitting element can be provided that allows improvement in light extraction efficiency of an element without losing current diffusivity in a semiconductor laminated body.

BRIEF DESCRIPTION OF THE DRAWINGS

Next, the present invention will be explained in more detail in conjunction with appended drawings, wherein:

FIG. 5 is a schematic cross sectional view showing a semiconductor light-emitting element in a second embodiment of the invention;

FIGS. 6A and 6B are schematic explanatory partial views of the semiconductor light-emitting element showing a current flow and a light path, wherein FIG. 6A shows the second embodiment and FIG. 6B shows a modification.

DETAILED DESCRIPTION OF THE PREFERRED EMBODIMENTS

Figure 1:
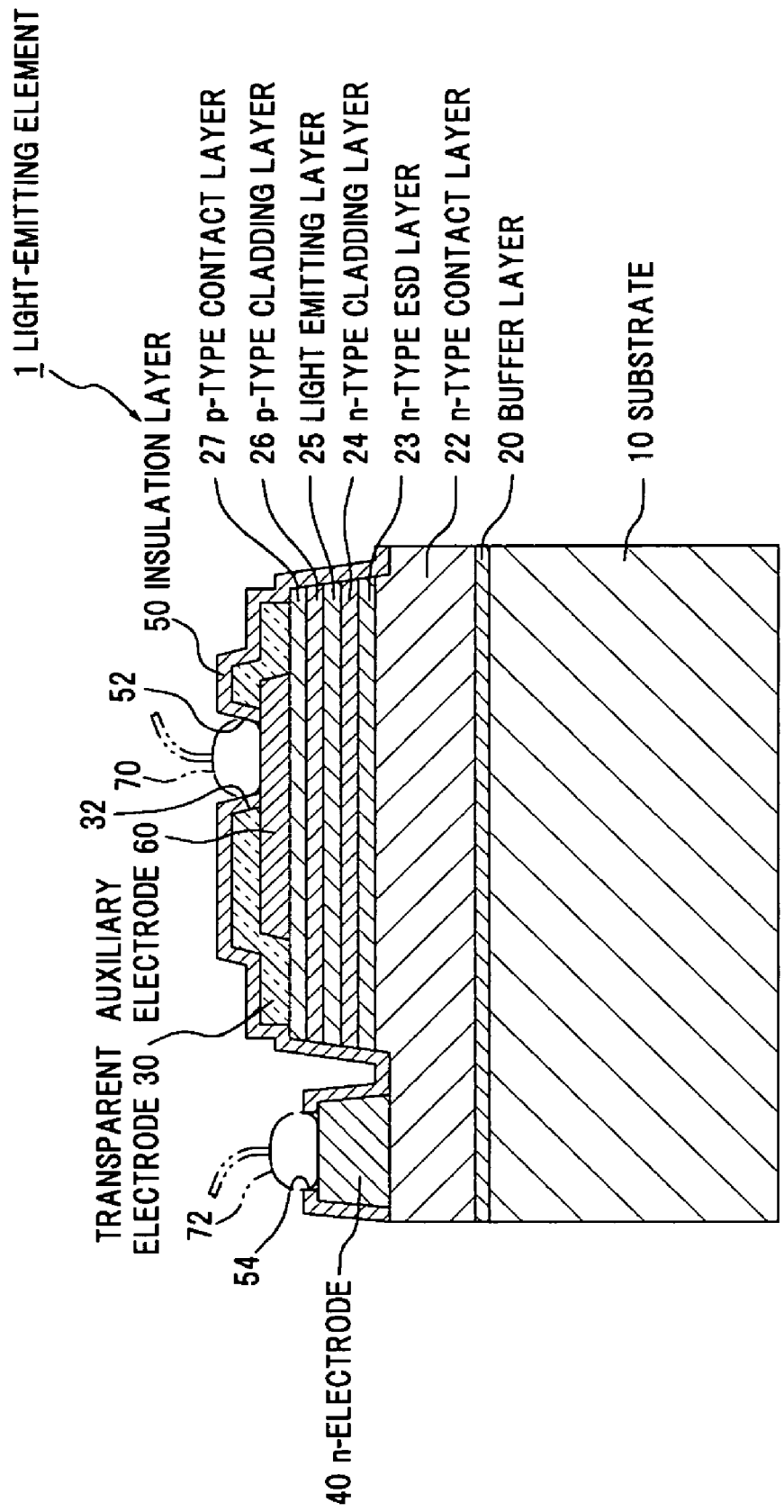
FIG. 1 is a schematic cross sectional view showing a semiconductor light-emitting element in a first embodiment of the present invention.
Figure 2:
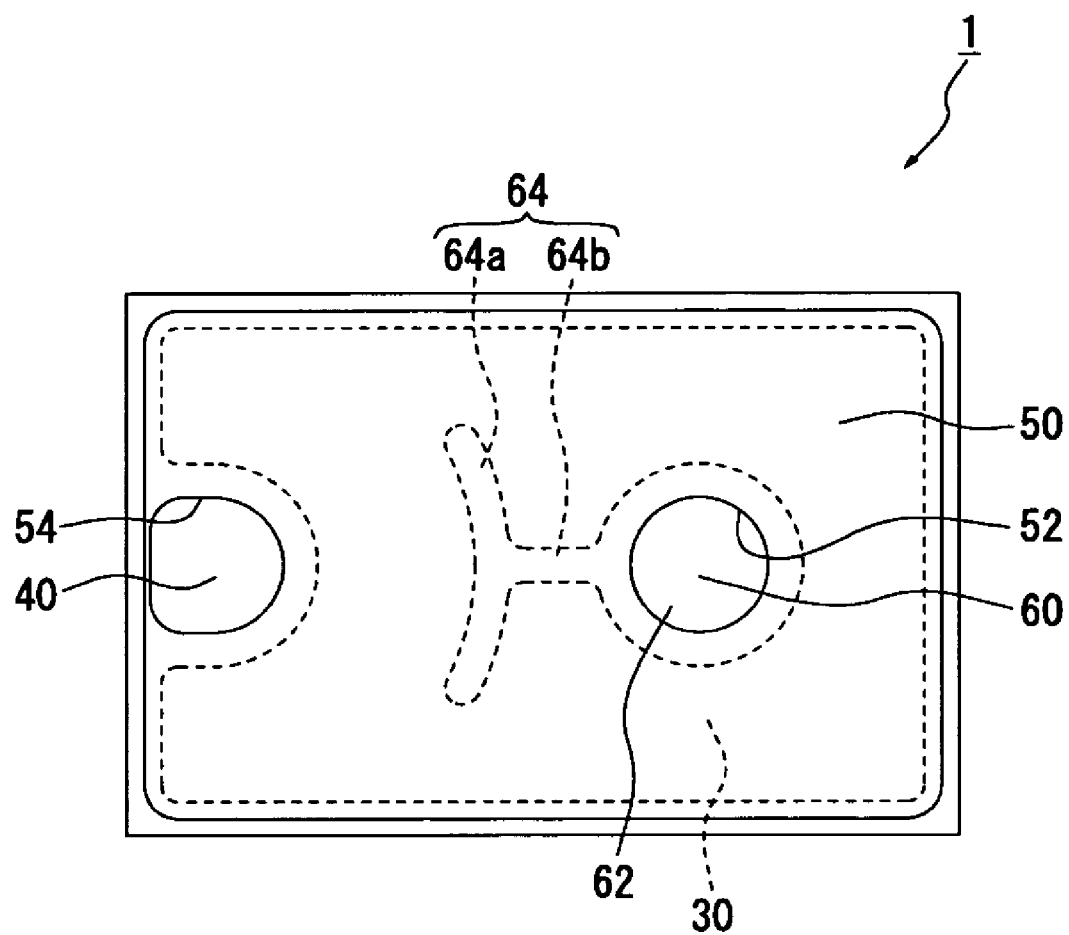
FIG. 2 is a schematic top view showing the semiconductor light-emitting element.
Figure 3:
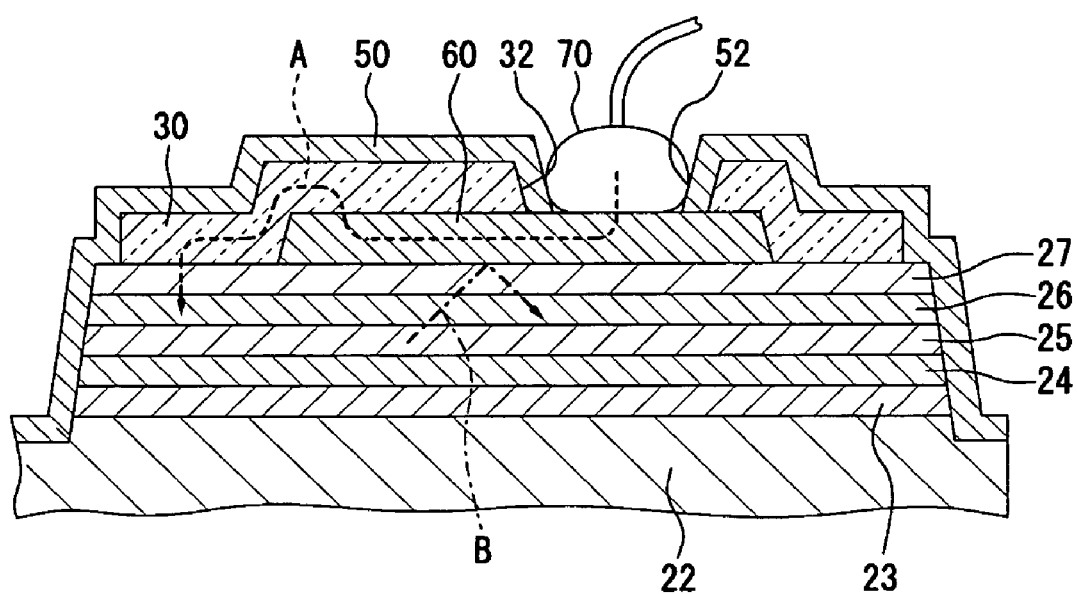
FIG. 3 is a schematic explanatory partial view of the semiconductor light-emitting element showing a current flow and a light path.

FIGS. 1 to 3 show the first embodiment of the invention. FIG. 1 is a schematic cross sectional view of a semiconductor light-emitting element.

As shown in FIG. 1, a light-emitting device 1 is a face-up type in which a transparent electrode 30 as a p-electrode and an n-electrode 40 are formed on the upper surface side. The light-emitting device 1 has a semiconductor laminated structure including a substrate 10 formed of sapphire, a buffer layer 20 provided on the substrate 10, an n-type contact layer 22 provided on the buffer layer 20, an n-type ESD layer 23 provided on the n-type contact layer 22, an n-type cladding layer 24 formed on the n-type ESD layer 23, a light-emitting layer 25 provided on the n-type cladding layer 24, a p-type cladding layer 26 provided on the light-emitting layer 25 and a p-type contact layer 27 provided on the p-type cladding layer 26. In addition, a portion of from the p-type contact layer 27 to the n-type contact layer 22 is removed by etching, thereby partially exposing the n-type contact layer 22.

Here, the buffer layer 20, the n-type contact layer 22, the n-type ESD layer 23, the n-type cladding layer 24, the light-emitting layer 25, the p-type cladding layer 26 and the p-type contact layer 27 are each formed of a group III nitride compound semiconductor. For the group III nitride compound semiconductor, it is possible to use, e.g., a quaternary group III nitride compound semiconductor represented by $Al_xGa_yIn_{1-x-y}N$ ($0 \leq x \leq 1$, $0 \leq y \leq 1$, and $0 \leq x+y \leq 1$).

In the present embodiment, the buffer layer 20 is formed of AlN. Meanwhile, the n-type contact layer 22, the n-type ESD layer 23 and the n-type cladding layer 24 are each formed of n-GaN doped with respective predetermined amounts of n-type dopant (e.g., Si). And then, the light-emitting layer 25 has a multiquantum well structure including plural well layers and plural barrier layers. The well layer is formed of, e.g., GaN and the barrier layer is formed of, e.g., InGaN or AlGaN, etc. In addition, the p-type cladding layer 26 and the p-type contact layer 27 are each formed of p-GaN doped with a predetermined amount of p-type dopant (e.g., Mg).

Each layer provided on the sapphire substrate 10, from the buffer layer 20 to the p-type contact layer 27, can be formed by, e.g., a metal organic chemical vapor deposition (MOCVD) method, a molecular beam epitaxy (MBE) method or a halide vapor phase epitaxy (HVPE) method, etc. The buffer layer 20 formed of AlN is shown as an example here, however, the buffer layer 20 can be formed of GaN. The quantum well structure of the light-emitting layer 25 can alternatively be a single quantum well structure or a strained quantum-well structure instead of the multiquantum well structure.

In addition, the light-emitting element 1 includes the transparent electrode 30 provided on the p-type contact layer 27, the n-electrode 40 provided on the n-type contact layer 22, and an insulation layer 50 formed on the transparent electrode 30, on the n-electrode 40 and on the semiconductor laminated structure. In addition, the light-emitting element 1 includes an auxiliary electrode 60 formed between the transparent electrode 30 and the p-type contact layer 27.

The transparent electrode 30 is formed of a conductive oxide, which is ITO (Indium Tin Oxide) in the present embodiment. Alternatively, the transparent electrode 30 can be formed of, e.g., indium gallium oxide (IGO), indium zinc oxide (IZO) or indium cerium oxide (ICO), etc. The transparent electrode 30 is formed by using, e.g., a vacuum deposition method, etc. Alternatively, the transparent electrode 30 can be formed by a sputtering method, a CVD method or a sol-gel method, etc.

In the auxiliary electrode 60, a layer in contact with the p-type contact layer 27 is formed of a metal having a relatively high reflectivity to the light emitted from the light-emitting layer 25. In addition, a material of which contact resistance with the p-type contact layer 27 is larger than that of the transparent electrode 30 is selected for the layer in the auxiliary electrode 60 in contact with the p-type contact layer 27. In the present embodiment, although the layer in the auxiliary electrode 60 in contact with the p-type contact layer 27 is formed of Al, a material other than Al can be used and it is possible to form from, e.g., Ag or Rh, etc., or an alloy consisting primarily of Al or Ag.

In the present embodiment, the auxiliary electrode 60 is formed by laminating a layer in contact with the p-type contact layer 27 and a front side layer formed thereon. The front side layer is preferably formed of a material that is easy to bond to a wire 70 and can protect the lower layer side from corrosion. Such a material includes, e.g., Au. In addition, the front side layer is preferably formed of a material having a sheet resistance smaller than the lower layer side. Furthermore, the auxiliary electrode 60 can be combined with a distributed Bragg reflector (DBR) formed of plural layers of two materials having different refractive indices which totally reflects the light emitted from the light-emitting layer 25. The auxiliary electrode 60 is formed by, e.g., a vacuum deposition method or a sputtering method, etc.

The n-electrode 40 is formed of metal such as, e.g., Ni, Cr, Al, Rh, Ti, V and Pt, which is in ohmic contact with the n-type contact layer 22. The n-electrode 40 can be composed of, e.g., a first layer formed of Ni and a second layer formed of Au. The n-electrode 40 is formed by, e.g., a vacuum deposition method or a sputtering method, etc.

In the present embodiment, $SiO_2$ is used as the insulation layer 50. Alternatively, other materials may be used as the insulation layer 50, and the insulation layer 50 can be formed of, e.g., a metal oxide other than $SiO_2$, such as $TiO_2$, $Al_2O_3$ or $Ta_2O_5$, or a resin material having electrical insulation properties such as polyimide. The insulation layer 50 is formed by, e.g., the vacuum deposition method, and alternatively can be formed by a chemical vapor deposition (CVD) method. The insulation layer 50 above the middle of the auxiliary electrode 60 and above the middle of the n-electrode 40 is removed by using photolithography technique and etching technique to form openings 52 and 54. In the present embodiment, the transparent electrode 30 has an opening 32 which is formed immediately below the opening 52 of the insulation layer 50. Bonding wires 70 and 72 are then connected to the auxiliary electrode 60 and the n-electrode 40 through the openings 32, 52 and 54.

FIG. 2 is a schematic top view showing the semiconductor light-emitting element.

As shown in FIG. 2, the light-emitting element 1 is formed in a substantially quadrangular shape in the top view, and is in a rectangular shape in the present embodiment. The n-electrode 40 is formed on one side in a longitudinal direction at the middle in a width direction, and the transparent electrode 30 is formed having a relatively large area in a region excluding the n-electrode so as to be separated from the n-electrode 40. The openings 52 and 54 of the insulation layer 50 are formed at the middle in the width direction so as to be separated from each other in the longitudinal direction. The transparent electrode 30 extends outward from the periphery of the auxiliary electrode 60 while covering a part of the auxiliary electrode 60 in a top view.

The auxiliary electrode 60 is formed immediately below the opening 52, and has a substantially circular wire connecting portion 62 and a linear extending portion 64 which extends from the wire connecting portion 62. In the present embodiment, the extending portion 64 has a semi-enclosing portion 64a which half surrounds the n-electrode 40 on the n-electrode 40 side from the wire connecting portion 62, and a coupling portion 64b for coupling the semi-enclosing portion 64a to the wire connecting portion 62.

In the light-emitting element 1 configured as described above, light having a wavelength in a blue region is emitted from the light-emitting layer 25 when forward voltage is applied to the auxiliary electrode 60 and the n-electrode 40. The light-emitting element 1 emits, e.g., light having a peak wavelength of about 455 nm when forward voltage is about 3V and forward current is 20 mA.

At this time, since the contact resistance of the transparent electrode 30 with the p-type contact layer 27 is lower than that of the auxiliary electrode 60, the current flows from the auxiliary electrode 60 to the p-type contact layer 27 via the transparent electrode 30 as shown by an arrow A in FIG. 3. In addition, the current preferentially flows to the auxiliary electrode 60 and then to the transparent electrode 30 after diffusion in the auxiliary electrode 60 since the auxiliary electrode 60 has a sheet resistance smaller than that of the transparent electrode 30. Therefore, it is possible to adequately diffuse the current and to increase a virtual light-emitting region of the light-emitting layer 25 in the top view.

In addition, among the light emitted from the light-emitting layer 25, the light incident on the auxiliary electrode 60 is reflected without entering the transparent electrode 30 as shown by an arrow B in FIG. 3. It is thereby possible to suppress absorption of light by the transparent electrode 30 and to improve the light extraction efficiency. Therefore, the improvement in the light extraction efficiency of the element is realized without losing current diffusivity in the semiconductor laminated body.

Meanwhile, when a transparent electrode formed of a conductive oxide and a metal having a relatively high reflectivity are continuously formed, the reflectivity may decrease due to a reaction at the interface therebetween. It is currently recognized that a combination of ITO and Al and that of ITO and Rh cause a phenomenon that the reflectivity at the interface therebetween decreases, although depending on manufacturing conditions. Since the auxiliary electrode 60 is formed between the transparent electrode 30 and the p-type contact layer 27 in the present embodiment, the light emitted from the light-emitting layer 25 is reflected at the auxiliary electrode 60 even if the reflectivity at the interface between the auxiliary electrode 60 and the transparent electrode 30 decreases, hence, the light does not enter the interface and is not absorbed. Therefore, the light-emitting element 1 with high light extraction efficiency can be obtained without considering manufacturing conditions or combinations of materials.

In addition, since two layers, the insulation layer 50 and the transparent electrode 30, cover the auxiliary electrode 60, it is possible to adequately protect the auxiliary electrode 60 from corrosion, etc., resulting in significant improvement in durability, etc., of the auxiliary electrode 60.

Figure 4:
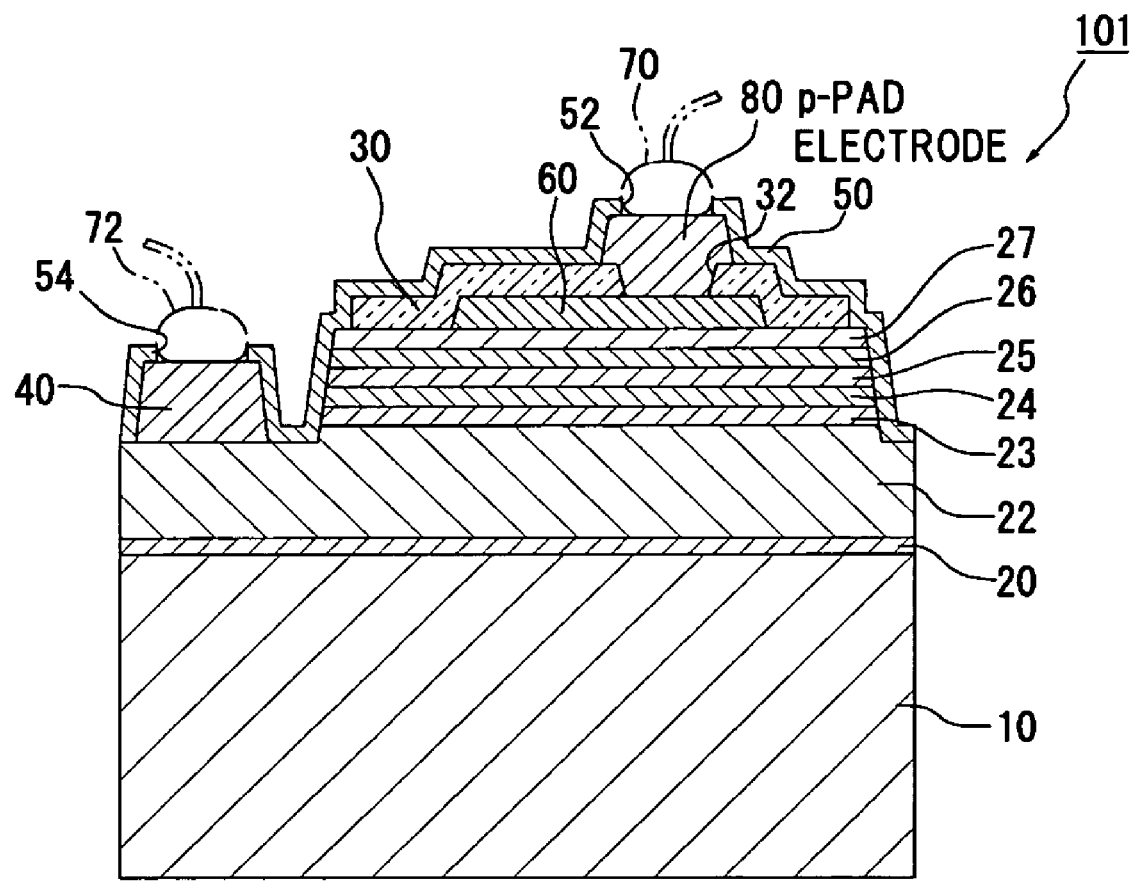
FIG. 4 is a schematic cross sectional view showing a semiconductor light-emitting element of a modification.

In the above-mentioned embodiment, the bonding wire 70 directly bonded to the auxiliary electrode 60 is shown. Alternatively, for example, as shown in FIG. 4, a p-pad electrode 80 that can have a higher bonding strength with the bonding wire 70 than the transparent electrode 30 and the auxiliary electrode 60 may be formed on the auxiliary electrode 60 and/or the transparent electrode 30. Since the p-pad electrode 80 as a surface electrode is formed so as to overlap within the auxiliary electrode 60 in the top view and the light is reflected at the auxiliary electrode 60, it is not necessary to take the reflectivity into consideration for selecting materials. Alternatively, the p-pad electrode 80 is formed on the transparent electrode 30 when the auxiliary electrode 60 is entirely covered by the transparent electrode 30 without forming the opening 32, and also in this case, it is preferable that the p-pad electrode 80 overlaps the auxiliary electrode 60 in the top view. Note that, the p-pad electrode 80 only needs to overlap at least a portion of the auxiliary electrode 60 in the top view.

Additionally, in this case, the material of the p-pad electrode 80 is preferably the same material as the n-electrode 40. This allows simultaneous formation of the p-pad electrode 80 and the n-electrode 40. When the n-electrode 40 is e.g., Ni/Au, the p-pad electrode 80 is also Ni/Au.

FIG. 5 is a schematic cross sectional view showing a semiconductor light-emitting element in a second embodiment of the invention.

As shown in FIG. 5, a light-emitting device 201 is a flip-chip type in which the transparent electrode 30 as a p-electrode and the n-electrode 40 are formed on the lower surface side. The light-emitting device 201 has a semiconductor laminated structure including the substrate 10, the buffer layer 20, the n-type contact layer 22, the n-type ESD layer 23, the n-type cladding layer 24, the light-emitting layer 25, the p-type cladding layer 26 and the p-type contact layer 27, and a portion of from the p-type contact layer 27 to the n-type contact layer 22 is removed by etching, thereby partially exposing the n-type contact layer 22.

In addition, the light-emitting device 201 includes the transparent electrode 30 provided on the p-type contact layer 27, the n-electrode 40 provided on the n-type contact layer 22, and the insulation layer 50 formed on the transparent electrode 30, on the n-electrode 40 and on the semiconductor laminated structure.

In the present embodiment, the insulation layer 50 is formed so as to include a reflective layer 90 which reflects the light emitted from the light-emitting layer 25. The reflective layer 90 is formed of a metal material, e.g., Al, which reflects the light emitted from the light-emitting layer 25. The reflective layer 90 can be formed of Ag, or an alloy consisting primarily of Al or Ag. Alternatively, the reflective layer 90 may be a distributed Bragg reflector formed of plural layers of two materials having different refractive indices.

In addition, the light-emitting device 201 includes an auxiliary electrode 260 intervening between the transparent electrode 30 and the p-type contact layer 27. The auxiliary electrode 260 is formed of a metal having a relatively high reflectivity to the light emitted from the light-emitting layer 25. In addition, a material of which contact resistance with the p-type contact layer 27 is larger than that of the transparent electrode 30 is selected for the auxiliary electrode 260.

Meanwhile, the insulation layer 50 below the middle of the auxiliary electrode 260 and below the middle of the n-electrode 40 is removed by using photolithography technique and etching technique to form openings 252 and 254. In the present embodiment, the transparent electrode 30 entirely covers the auxiliary electrode 260. The transparent electrode 30 extends outward from the periphery of the auxiliary electrode 260 in a top view. Bump electrodes 270 and 272 are connected to the auxiliary electrode 260 and the n-electrode 40 through openings 232, 252 and 254.

Figure 6A:
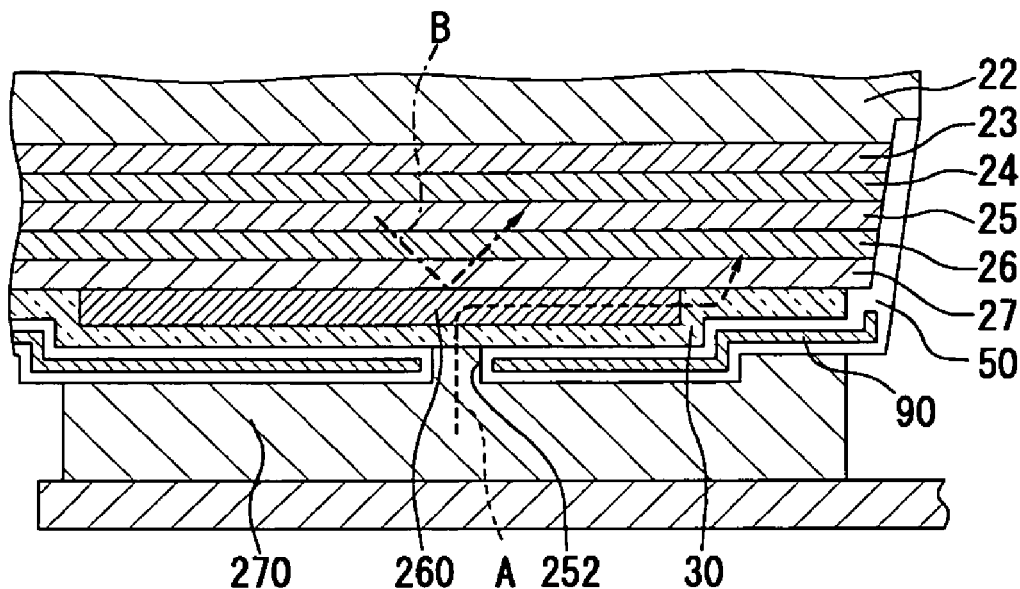

In the light-emitting element 201 configured as described above, since the contact resistance of the transparent electrode 30 with the p-type contact layer 27 is lower than that of the auxiliary electrode 260, the current flows from the auxiliary electrode 260 to the p-type contact layer 27 via the transparent electrode 30 as shown by an arrow A in FIG. 6A. In addition, the current preferentially flows to the auxiliary electrode 260 and then to the transparent electrode 30 after diffusion in the auxiliary electrode 260 since the auxiliary electrode 260 has a sheet resistance smaller than that of the transparent electrode 30. Therefore, it is possible to adequately diffuse the current and to increase a virtual light-emitting region of the light-emitting layer 25 in the top view.

In addition, among the light emitted from the light-emitting layer 25, the light incident on the auxiliary electrode 260 is reflected without entering the transparent electrode 30 as shown by an arrow B in FIG. 6A. It is thereby possible to suppress absorption of light by the transparent electrode 30 and to improve the light extraction efficiency.

In addition, since the auxiliary electrode 260 is formed between the transparent electrode 30 and the p-type contact layer 27, the light emitted from the light-emitting layer 25 is reflected at the auxiliary electrode 260 even if the reflectivity at the interface between the auxiliary electrode 260 and the transparent electrode 30 decreases, hence, the light does not enter the interface and is not absorbed. Therefore, the light-emitting element 201 with high light extraction efficiency can be obtained without considering manufacturing conditions or combinations of material.

In addition, since two layers, the insulation layer 50 and the transparent electrode 30, cover the auxiliary electrode 260, it is possible to adequately protect the auxiliary electrode 260 from corrosion, etc., resulting in significant improvement in durability, etc., of the auxiliary electrode 260.

Figure 6B:
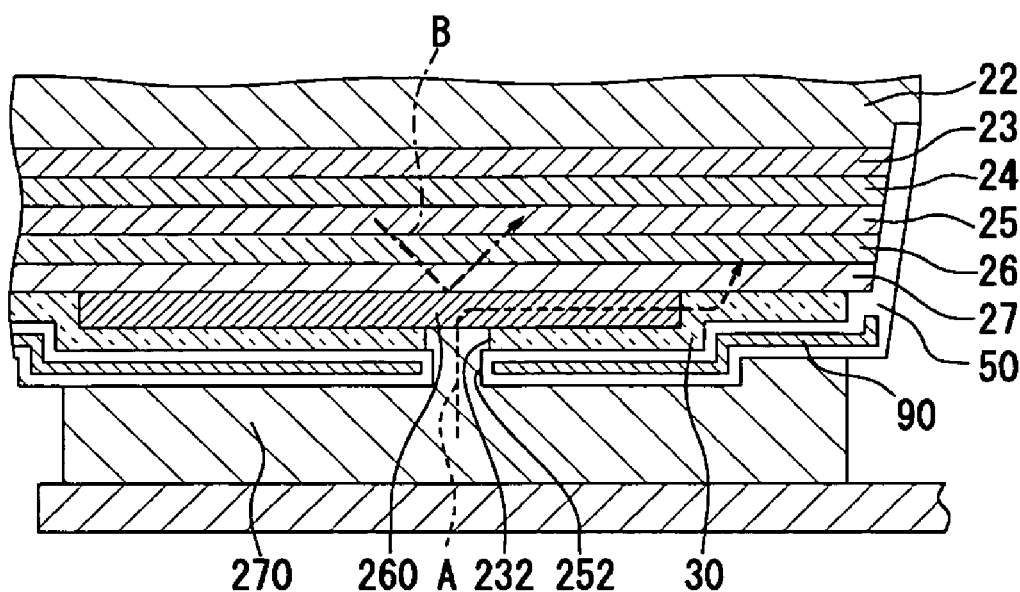

It should be noted that, although the auxiliary electrode 260 entirely covered by the transparent electrode 30 is shown in the above-mentioned embodiment, the opening 232 may be formed in the transparent electrode 30 immediately above the opening 252 of the insulation layer 50, for example, as shown in FIG. 6B.

Figure 6C:
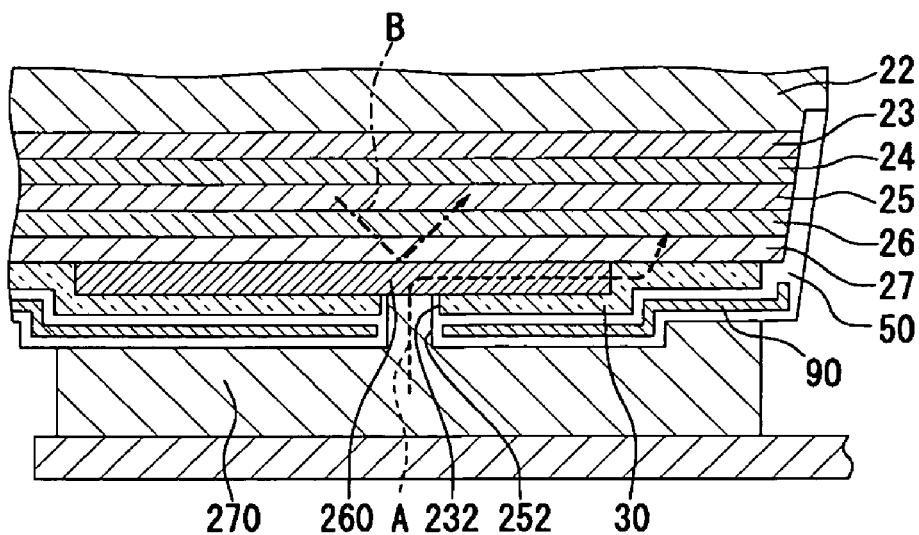
FIGS. 6C and 6D are schematic explanatory partial views of the semiconductor light-emitting element showing a current flow and a light path, and both show modifications.
Figure 6D:
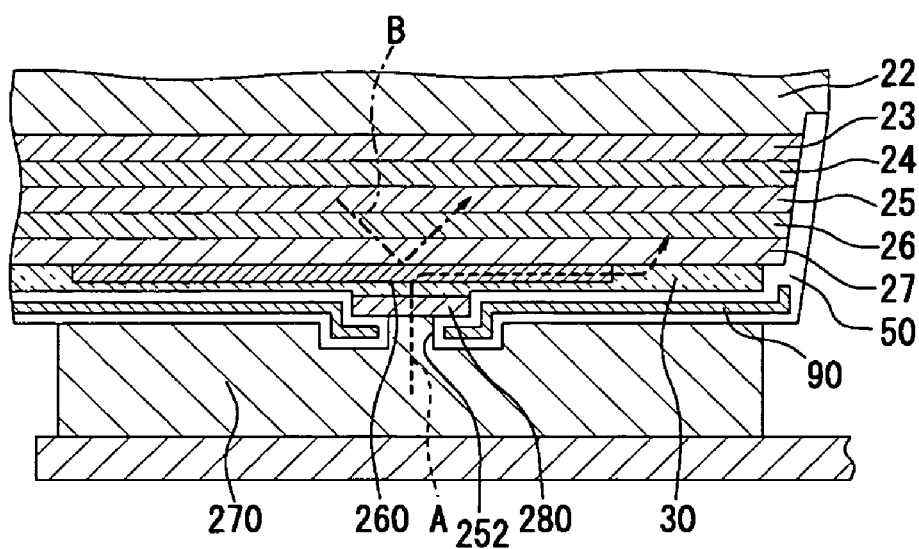

In addition, although the opening 232 of the transparent electrode 30 is in contact with the bump (solder bump) 270 in the above-mentioned embodiment, the opening 232 may be covered by the insulation layer 50 so that the transparent electrode 30 does not directly contact with the bump 270, for example, as shown in FIG. 6C. Furthermore, as shown in FIG. 6D, an intermediate electrode 280 as a surface electrode may be formed on the transparent electrode 30. The intermediate electrode 280 is formed of a metal that can have a higher bonding strength with the bump 270 than the transparent electrode 30 and/or the auxiliary electrode 260.

In addition, although a GaN-based semiconductor used as a semiconductor laminated body is shown in the above-mentioned embodiment, it is possible to use an AlGaAs-, GaAsP-, GaP-, ZnSe- or AlGaInP-based semiconductor material, etc. In addition, although the semiconductor laminated body including an n-type layer formed as a first conductivity type layer and a p-type layer formed as a second conductivity type layer is shown, it may include a p-type layer as a first conductivity type layer and an n-type layer as a second conductivity type layer, or layers of conductivity type other than n-type and p-type may be used.

In addition, although sapphire is used for the substrate in the above-mentioned embodiment, the substrate can be formed of GaN, etc., and materials of the n-electrode and the auxiliary electrode, etc., can be arbitrarily changed, and other specific detailed structure, etc., can be, of course, appropriately changed.

Although the invention has been described with respect to the specific embodiments for complete and clear disclosure, the appended claims are not to be therefore limited but are to be construed as embodying all modifications and alternative constructions that may occur to one skilled in the art which fairly fall within the basic teaching herein set forth.

What is claimed is:

1. A semiconductor light-emitting element, comprising:
   a semiconductor laminated body comprising a first conductivity type layer, a light-emitting layer and a second conductivity type layer in this order;
   a transparent electrode formed on the first conductivity type layer and comprising an oxide; and
   an auxiliary electrode formed between the first conductivity type layer and the transparent electrode, the auxiliary electrode having a larger contact resistance with the first conductivity type layer and a smaller sheet resistance than the transparent electrode,
   wherein both the transparent electrode and the auxiliary electrode contact the first conductivity type layer, and
   wherein the transparent electrode extends outward from a periphery of the auxiliary electrode while covering a part of the auxiliary electrode in a top view.

2. The semiconductor light-emitting element according to claim 1, wherein the auxiliary electrode comprises a linear extending portion.

3. The semiconductor light-emitting element according to claim 2, further comprising a surface electrode formed on the auxiliary electrode or the transparent electrode so as to overlap at least a portion of the auxiliary electrode in a top view.

4. The semiconductor light-emitting element according to claim 3, further comprising a second conductivity type layer electrode formed on the second conductivity type layer and comprising the same material as the surface electrode.

5. The semiconductor light-emitting element according to claim 4, wherein the semiconductor light-emitting element comprises a face-up type semiconductor light-emitting element, and
   wherein the surface electrode has a higher bonding strength with a bonding wire than the transparent electrode and the auxiliary electrode.

6. The semiconductor light-emitting element according to claim 4, wherein the semiconductor light-emitting element comprises a flip-chip type semiconductor light-emitting element, and
   wherein the surface electrode has a higher bonding strength with a bump than the transparent electrode and the auxiliary electrode.

7. The semiconductor light-emitting element according to claim 3, wherein the semiconductor light-emitting element comprises a face-up type semiconductor light-emitting element, and
   wherein the surface electrode has a higher bonding strength with a bonding wire than the transparent electrode and the auxiliary electrode.

8. The semiconductor light-emitting element according to claim 3, wherein the semiconductor light-emitting element comprises a flip-chip type semiconductor light-emitting element, and
   wherein the surface electrode has a higher bonding strength with a bump than the transparent electrode and the auxiliary electrode.

9. The semiconductor light-emitting element according to claim 1, wherein the auxiliary electrode has a higher reflectivity to light emitted from the light-emitting layer than that of the transparent electrode.

* * * * *